United States Patent
Bongiovi et al.

(10) Patent No.: US 9,564,146 B2
(45) Date of Patent: Feb. 7, 2017

(54) SYSTEM AND METHOD FOR DIGITAL SIGNAL PROCESSING IN DEEP DIVING ENVIRONMENT

(71) Applicants: Anthony Bongiovi, Port St. Lucie, FL (US); Ryan Copt, Port St. Lucie, FL (US); Phillip Fuller, New York, NY (US); Joseph Butera, III, Stuart, FL (US); Glenn Zelniker, Gainesville, FL (US)

(72) Inventors: Anthony Bongiovi, Port St. Lucie, FL (US); Ryan Copt, Port St. Lucie, FL (US); Phillip Fuller, New York, NY (US); Joseph Butera, III, Stuart, FL (US); Glenn Zelniker, Gainesville, FL (US)

(73) Assignee: Bongiovi Acoustics LLC, Port St. Lucie, FL (US)

( * ) Notice: Subject to any disclaimer, the term of this patent is extended or adjusted under 35 U.S.C. 154(b) by 26 days.

(21) Appl. No.: 14/449,645

(22) Filed: Aug. 1, 2014

(65) Prior Publication Data

US 2016/0036402 A1    Feb. 4, 2016

(51) Int. Cl.
| | | |
|---|---|---|
| G10L 21/02 | (2013.01) | |
| B63C 11/26 | (2006.01) | |
| H03G 5/16 | (2006.01) | |
| H03G 3/20 | (2006.01) | |
| H03G 5/02 | (2006.01) | |
| G10L 21/003 | (2013.01) | |

(52) U.S. Cl.
CPC ............ *G10L 21/0205* (2013.01); *B63C 11/26* (2013.01); *G10L 21/003* (2013.01); *H03G 3/20* (2013.01); *H03G 5/025* (2013.01); *H03G 5/165* (2013.01)

(58) Field of Classification Search
CPC .......... H03G 5/025; H03G 5/165; H03G 3/20; H03G 3/00
USPC ................ 381/98, 103, 56, 58, 63; 333/28 R
See application file for complete search history.

(56) References Cited

U.S. PATENT DOCUMENTS

| | | | |
|---|---|---|---|
| 3,795,876 A | | 3/1974 | Takahashi et al. |
| 3,813,687 A | * | 5/1974 | Geil ........................ G11B 33/06 360/7 |

(Continued)

FOREIGN PATENT DOCUMENTS

| | | |
|---|---|---|
| AU | 2005274099 | 10/2010 |
| AU | 20070325096 | 4/2012 |

(Continued)

OTHER PUBLICATIONS

U.S. Appl. No. 12/648,007, filed Jul. 1, 2010, Bongiovi.

(Continued)

*Primary Examiner* — Disler Paul
(74) *Attorney, Agent, or Firm* — Malloy & Malloy, P.L.

(57) ABSTRACT

The present invention relates to a system for processing of an audio signal relating to a diver in a deep diving environment. The system comprises an input device structured to receive the signal, a pitch changing module configured to change the pitch of the received signal, a plurality of processing modules collectively configured to process the pitch changed signal and produce a processed signal. The present invention is further directed to a method for processing of an audio signal relating to a diver in a deep diving environment.

32 Claims, 5 Drawing Sheets

(56) References Cited

U.S. PATENT DOCUMENTS

| | | |
|---|---|---|
| 4,162,462 A | 7/1979 | Endoh et al. |
| 4,184,047 A | 1/1980 | Langford |
| 4,218,950 A | 8/1980 | Uetrecht |
| 4,226,533 A | 10/1980 | Snowman |
| 4,257,325 A | 3/1981 | Bertagni |
| 4,353,035 A | 10/1982 | Schröder |
| 4,356,558 A | 10/1982 | Owen et al. |
| 4,363,007 A | 12/1982 | Haramoto et al. |
| 4,412,100 A | 10/1983 | Orban |
| 4,517,415 A | 5/1985 | Laurence |
| 4,538,297 A | 8/1985 | Waller |
| 4,549,289 A | 10/1985 | Schwartz et al. |
| 4,584,700 A | 4/1986 | Scholz |
| 4,602,381 A | 7/1986 | Cugnini et al. |
| 4,612,665 A | 9/1986 | Inami et al. |
| 4,641,361 A | 2/1987 | Rosback |
| 4,677,645 A | 6/1987 | Kaniwa et al. |
| 4,696,044 A | 9/1987 | Waller, Jr. |
| 4,701,953 A | 10/1987 | White |
| 4,704,726 A | 11/1987 | Gibson |
| 4,715,559 A | 12/1987 | Fuller |
| 4,739,514 A | 4/1988 | Short et al. |
| 4,815,142 A | 3/1989 | Imreh |
| 4,856,068 A | 8/1989 | Quatieri, Jr. et al. |
| 4,887,299 A | 12/1989 | Cummins et al. |
| 4,997,058 A | 3/1991 | Bertagni |
| 5,007,707 A | 4/1991 | Bertagni |
| 5,073,936 A | 12/1991 | Gorike et al. |
| 5,133,015 A | 7/1992 | Scholz |
| 5,210,806 A | 5/1993 | Kihara et al. |
| 5,239,997 A | 8/1993 | Guarino |
| 5,355,417 A | 10/1994 | Burdisso et al. |
| 5,361,381 A | 11/1994 | Short |
| 5,425,107 A | 6/1995 | Bertagni et al. |
| 5,463,695 A | 10/1995 | Werrbach |
| 5,465,421 A | 11/1995 | McCormick et al. |
| 5,467,775 A | 11/1995 | Callahan et al. |
| 5,473,214 A | 12/1995 | Hildebrand |
| 5,515,444 A | 5/1996 | Burdisso et al. |
| 5,539,835 A | 7/1996 | Bertagni et al. |
| 5,541,866 A | 7/1996 | Sato et al. |
| 5,572,443 A | 11/1996 | Emoto et al. |
| 5,615,275 A | 3/1997 | Bertagni |
| 5,617,480 A | 4/1997 | Ballard et al. |
| 5,638,456 A | 6/1997 | Conley et al. |
| 5,640,685 A | 6/1997 | Komoda |
| 5,671,287 A | 9/1997 | Gerzon |
| 5,693,917 A | 12/1997 | Bertagni et al. |
| 5,699,438 A | 12/1997 | Smith et al. |
| 5,727,074 A | 3/1998 | Hildebrand |
| 5,737,432 A | 4/1998 | Werrbach |
| 5,828,768 A | 10/1998 | Eatwell et al. |
| 5,832,097 A | 11/1998 | Armstrong et al. |
| 5,838,805 A | 11/1998 | Warnaka et al. |
| 5,848,164 A | 12/1998 | Levine |
| 5,872,852 A | 2/1999 | Dougherty |
| 5,901,231 A | 5/1999 | Parrella et al. |
| 5,990,955 A | 11/1999 | Koz |
| 6,058,196 A | 5/2000 | Heron |
| 6,078,670 A * | 6/2000 | Beyer .................. H03G 5/10 381/101 |
| 6,093,144 A | 7/2000 | Jaeger et al. |
| 6,108,431 A | 8/2000 | Bachler |
| 6,201,873 B1 | 3/2001 | Dal Farra |
| 6,208,237 B1 | 3/2001 | Saiki et al. |
| 6,263,354 B1 | 7/2001 | Gandhi |
| 6,285,767 B1 | 9/2001 | Klayman |
| 6,292,511 B1 | 9/2001 | Goldston et al. |
| 6,317,117 B1 | 11/2001 | Goff |
| 6,318,797 B1 | 11/2001 | Böhm et al. |
| 6,332,029 B1 | 12/2001 | Azima et al. |
| 6,518,852 B1 | 2/2003 | Derrick |
| 6,535,846 B1 | 3/2003 | Shashoua |
| 6,570,993 B1 | 5/2003 | Fukuyama |
| 6,618,487 B1 | 9/2003 | Azima et al. |
| 6,661,897 B2 | 12/2003 | Smith |
| 6,661,900 B1 | 12/2003 | Allred et al. |
| 6,772,114 B1 | 8/2004 | Sluijter et al. |
| 6,847,258 B2 | 1/2005 | Ishida et al. |
| 6,871,525 B2 | 3/2005 | Withnall et al. |
| 6,907,391 B2 | 6/2005 | Bellora et al. |
| 6,999,826 B1 | 2/2006 | Zhou et al. |
| 7,006,653 B2 | 2/2006 | Guenther |
| 7,016,746 B2 | 3/2006 | Wiser et al. |
| 7,024,001 B1 | 4/2006 | Nakada |
| 7,058,463 B1 | 6/2006 | Ruha et al. |
| 7,123,728 B2 | 10/2006 | King et al. |
| 7,254,243 B2 | 8/2007 | Bongiovi |
| 7,266,205 B2 | 9/2007 | Miller |
| 7,274,795 B2 | 9/2007 | Bongiovi |
| 7,519,189 B2 | 4/2009 | Bongiovi |
| 7,577,263 B2 | 8/2009 | Tourwe |
| 7,613,314 B2 | 11/2009 | Camp, Jr. |
| 7,676,048 B2 | 3/2010 | Tsutsui |
| 7,711,442 B2 | 5/2010 | Ryle et al. |
| 7,778,718 B2 | 8/2010 | Janke et al. |
| 7,916,876 B1 | 3/2011 | Helsloot |
| 1,272,765 A1 | 9/2011 | Hicks et al. |
| 8,068,621 B2 | 11/2011 | Okabayashi et al. |
| 8,160,274 B2 | 4/2012 | Bongiovi |
| 8,175,287 B2 | 5/2012 | Ueno et al. |
| 8,229,136 B2 | 7/2012 | Bongiovi |
| 8,284,955 B2 | 10/2012 | Bonglovi et al. |
| 8,462,963 B2 | 6/2013 | Bongiovi |
| 8,472,642 B2 | 6/2013 | Bongiovi |
| 8,503,701 B2 | 8/2013 | Miles et al. |
| 8,565,449 B2 * | 10/2013 | Bongiovi ............ G10L 21/0208 333/28 R |
| 8,705,765 B2 | 4/2014 | Bongiovi |
| 8,879,743 B1 | 11/2014 | Mitra |
| 9,195,433 B2 | 11/2015 | Bongiovi et al. |
| 9,264,004 B2 | 2/2016 | Bongiovi et al. |
| 9,276,542 B2 | 3/2016 | Bongiovi et al. |
| 9,281,794 B1 | 3/2016 | Bongiovi et al. |
| 9,344,828 B2 | 5/2016 | Bongiovi et al. |
| 9,348,904 B2 | 5/2016 | Bongiovi et al. |
| 9,350,309 B2 | 5/2016 | Bongiovi et al. |
| 9,397,629 B2 | 7/2016 | Bongiovi et al. |
| 9,398,394 B2 | 7/2016 | Bongiovi et al. |
| 2001/0008535 A1 | 7/2001 | Lanigan |
| 2001/0043704 A1 | 11/2001 | Schwartz |
| 2002/0057808 A1 | 5/2002 | Goldstein |
| 2002/0094096 A1 | 7/2002 | Paritsky et al. |
| 2003/0016838 A1 | 1/2003 | Paritsky et al. |
| 2003/0023429 A1 | 1/2003 | Claesson |
| 2003/0035555 A1 | 2/2003 | King et al. |
| 2003/0043940 A1 | 3/2003 | Janky et al. |
| 2003/0112088 A1 | 6/2003 | Bizjak |
| 2003/0138117 A1 | 7/2003 | Goff |
| 2003/0142841 A1 | 7/2003 | Wiegand |
| 2003/0164546 A1 | 9/2003 | Giger |
| 2003/0179891 A1 | 9/2003 | Rabinowitz et al. |
| 2003/0216907 A1 | 11/2003 | Thomas |
| 2004/0022400 A1 | 2/2004 | Magrath |
| 2004/0044804 A1 | 3/2004 | Mac Farlane |
| 2004/0086144 A1 | 5/2004 | Kallen |
| 2004/0138769 A1 | 7/2004 | Akiho |
| 2004/0146170 A1 | 7/2004 | Zint |
| 2005/0090295 A1 | 4/2005 | Ali et al. |
| 2005/0117771 A1 | 6/2005 | Vosburgh et al. |
| 2005/0129248 A1 | 6/2005 | Kraemer et al. |
| 2005/0175185 A1 | 8/2005 | Korner |
| 2005/0201572 A1 | 9/2005 | Lindahl et al. |
| 2005/0249272 A1 | 11/2005 | Kirkeby et al. |
| 2005/0254564 A1 | 11/2005 | Tsutsui |
| 2006/0034467 A1 | 2/2006 | Sleboda et al. |
| 2006/0064301 A1 | 3/2006 | Aguilar et al. |
| 2006/0098827 A1 | 5/2006 | Paddock et al. |
| 2006/0126851 A1 | 6/2006 | Yuen et al. |
| 2006/0126865 A1 | 6/2006 | Blamey et al. |
| 2006/0138285 A1 | 6/2006 | Oleski et al. |
| 2006/0140319 A1 | 6/2006 | Eldredge et al. |
| 2006/0189841 A1 | 8/2006 | Pluvinage |
| 2006/0291670 A1 | 12/2006 | King et al. |

(56) References Cited

U.S. PATENT DOCUMENTS

| | | |
|---|---|---|
| 2007/0010132 A1 | 1/2007 | Nelson |
| 2007/0173990 A1 | 7/2007 | Smith et al. |
| 2007/0177459 A1 | 8/2007 | Behn |
| 2007/0206643 A1 | 9/2007 | Egan |
| 2007/0223713 A1 | 9/2007 | Gunness |
| 2007/0223717 A1 | 9/2007 | Boersma |
| 2007/0253577 A1 | 11/2007 | Yen et al. |
| 2008/0031462 A1 | 2/2008 | Walsh et al. |
| 2008/0040116 A1 | 2/2008 | Cronin |
| 2008/0069385 A1 | 3/2008 | Revit |
| 2008/0112576 A1 | 5/2008 | Bongiovi |
| 2008/0123870 A1 | 5/2008 | Stark |
| 2008/0123873 A1 | 5/2008 | Bjorn-Josefsen et al. |
| 2008/0137881 A1 | 6/2008 | Bongiovi |
| 2008/0165989 A1 | 7/2008 | Seil et al. |
| 2008/0181424 A1 | 7/2008 | Schulein et al. |
| 2008/0219459 A1 | 9/2008 | Bongiovi et al. |
| 2008/0255855 A1 | 10/2008 | Lee et al. |
| 2009/0022328 A1 | 1/2009 | Neugebauer et al. |
| 2009/0054109 A1 | 2/2009 | Hunt |
| 2009/0062946 A1 | 3/2009 | Bongiovi et al. |
| 2009/0086996 A1 | 4/2009 | Bongiovi et al. |
| 2009/0290725 A1 | 11/2009 | Huang |
| 2009/0296959 A1 | 12/2009 | Bongiovi |
| 2010/0166222 A1* | 7/2010 | Bongiovi ............ G10L 21/0208 381/103 |
| 2010/0256843 A1 | 10/2010 | Bergstein et al. |
| 2010/0278364 A1 | 11/2010 | Berg |
| 2010/0303278 A1 | 12/2010 | Sahyoun |
| 2011/0013736 A1 | 1/2011 | Tsukamoto et al. |
| 2011/0087346 A1 | 4/2011 | Larsen et al. |
| 2011/0194712 A1 | 8/2011 | Potard |
| 2011/0230137 A1 | 9/2011 | Hicks et al. |
| 2011/0257833 A1 | 10/2011 | Trush et al. |
| 2012/0014553 A1 | 1/2012 | Bonanno |
| 2012/0099741 A1 | 4/2012 | Gotoh et al. |
| 2012/0170759 A1 | 7/2012 | Yuen et al. |
| 2012/0213034 A1 | 8/2012 | Imran |
| 2012/0213375 A1 | 8/2012 | Mahabub et al. |
| 2012/0302920 A1 | 11/2012 | Bridger et al. |
| 2013/0121507 A1 | 5/2013 | Bongiovi et al. |
| 2013/0162908 A1 | 6/2013 | Son et al. |
| 2013/0163783 A1* | 6/2013 | Burlingame ............ H03G 5/005 381/103 |
| 2013/0169779 A1 | 7/2013 | Pedersen |
| 2013/0227631 A1 | 8/2013 | Sharma et al. |
| 2013/0242191 A1 | 9/2013 | Leyendecker |
| 2013/0288596 A1 | 10/2013 | Suzuki et al. |
| 2013/0338504 A1 | 12/2013 | Demos et al. |
| 2014/0100682 A1 | 4/2014 | Bongiovi |
| 2014/0112497 A1 | 4/2014 | Bongiovi et al. |
| 2014/0153765 A1 | 6/2014 | Gan et al. |
| 2014/0185829 A1 | 7/2014 | Bongiovi |
| 2014/0369504 A1 | 12/2014 | Bongiovi et al. |
| 2014/0379355 A1 | 12/2014 | Hosokawsa |
| 2015/0215720 A1* | 7/2015 | Carroll ................... H04S 3/006 381/1 |
| 2015/0297169 A1 | 10/2015 | Copt et al. |
| 2015/0297170 A1 | 10/2015 | Copt et al. |
| 2016/0036402 A1 | 2/2016 | Bongiovi et al. |
| 2016/0044436 A1 | 2/2016 | Copt et al. |
| 2016/0240208 A1 | 8/2016 | Bongiovi et al. |
| 2016/0258907 A1 | 9/2016 | Butera, III et al. |

FOREIGN PATENT DOCUMENTS

| | | |
|---|---|---|
| AU | 2012202127 | 7/2014 |
| BR | 96114177 | 2/1999 |
| BR | 96113723 | 7/1999 |
| CA | 2533221 | 6/1995 |
| CA | 2161412 | 4/2000 |
| CA | 2576829 | 7/2014 |
| CN | 101589429 | 11/2009 |
| CN | 102265641 | 11/2011 |
| CN | 102652337 | 8/2012 |
| CN | 0780050323X | 5/2013 |
| CN | 203057339 | 7/2013 |
| EP | 0206746 B1 | 8/1992 |
| EP | 0541646 | 1/1995 |
| EP | 0580579 | 6/1998 |
| EP | 0698298 | 2/2000 |
| EP | 0932523 | 6/2000 |
| EP | 0666012 | 11/2002 |
| ES | 2218599 | 10/1998 |
| ES | 2249788 | 10/1998 |
| ES | 2219949 | 8/1999 |
| GB | 2003707 A | 3/1979 |
| GB | 2320393 | 12/1996 |
| ID | P0031074 | 6/2012 |
| IN | 260362 | 4/2014 |
| IS | 198914 | 7/2014 |
| JP | 3150910 | 6/1991 |
| JP | 2007106876 | 4/1995 |
| JP | 1020040022442 | 3/2004 |
| JP | 2005500768 | 1/2005 |
| JP | 1020090101209 | 9/2009 |
| JP | 4787255 | 7/2011 |
| JP | 5048782 | 7/2012 |
| JP | 201543561 | 3/2015 |
| KR | 1020040022442 | 3/2004 |
| KR | 1020090101209 | 9/2009 |
| KR | 101503541 | 3/2015 |
| MO | J001182 | 10/2013 |
| MX | 274143 | 8/2005 |
| MX | 301172 | 11/2006 |
| MX | 315197 | 11/2013 |
| NZ | 553744 | 1/2009 |
| NZ | 574141 | 4/2010 |
| NZ | 557201 | 5/2012 |
| PH | 12009501073 | 11/2014 |
| RU | 2407142 | 12/2010 |
| RU | 2483363 | 5/2013 |
| SG | 152762 | 12/2011 |
| SG | 155213 | 2/2013 |
| SU | 1319288 | 6/1987 |
| WO | WO 9219080 | 10/1992 |
| WO | WO 9311637 | 6/1993 |
| WO | WO 9321743 | 10/1993 |
| WO | WO 9427331 | 11/1994 |
| WO | WO 9514296 | 5/1995 |
| WO | WO 9531805 | 11/1995 |
| WO | WO 9535628 | 12/1995 |
| WO | WO 9601547 | 1/1996 |
| WO | WO 9611465 | 4/1996 |
| WO | WO 9708847 | 3/1997 |
| WO | WO 9709698 | 3/1997 |
| WO | WO 9709840 | 3/1997 |
| WO | WO 9709841 | 3/1997 |
| WO | WO 9709842 | 3/1997 |
| WO | WO 9709843 | 3/1997 |
| WO | WO 9709844 | 3/1997 |
| WO | WO 9709845 | 3/1997 |
| WO | WO 9709846 | 3/1997 |
| WO | WO 9709848 | 3/1997 |
| WO | WO 9709849 | 3/1997 |
| WO | WO 9709852 | 3/1997 |
| WO | WO 9709853 | 3/1997 |
| WO | WO 9709854 | 3/1997 |
| WO | WO 9709855 | 3/1997 |
| WO | WO 9709856 | 3/1997 |
| WO | WO 9709857 | 3/1997 |
| WO | WO 9709858 | 3/1997 |
| WO | WO 9709859 | 3/1997 |
| WO | WO 9709861 | 3/1997 |
| WO | WO 9709862 | 3/1997 |
| WO | WO 9717818 | 5/1997 |
| WO | WO 9717820 | 5/1997 |
| WO | WO 9813942 | 4/1998 |
| WO | WO 9816409 | 4/1998 |
| WO | WO 9828942 | 7/1998 |
| WO | WO 9831188 | 7/1998 |
| WO | WO 9834320 | 8/1998 |
| WO | WO 9839947 | 9/1998 |

(56) References Cited

FOREIGN PATENT DOCUMENTS

| | | |
|---|---|---|
| WO | WO 9842536 | 10/1998 |
| WO | WO 9843464 | 10/1998 |
| WO | WO 9852381 | 11/1998 |
| WO | WO 9852383 | 11/1998 |
| WO | WO 9853638 | 11/1998 |
| WO | WO 9902012 | 1/1999 |
| WO | WO 9908479 | 2/1999 |
| WO | WO 9911490 | 3/1999 |
| WO | WO 9912387 | 3/1999 |
| WO | WO 9913684 | 3/1999 |
| WO | WO 9921397 | 4/1999 |
| WO | WO 9935636 | 7/1999 |
| WO | WO 9935883 | 7/1999 |
| WO | WO 9937121 | 7/1999 |
| WO | WO 9938155 | 7/1999 |
| WO | WO 9941939 | 8/1999 |
| WO | WO 9952322 | 10/1999 |
| WO | WO 9952324 | 10/1999 |
| WO | WO 9956497 | 11/1999 |
| WO | WO 9962294 | 12/1999 |
| WO | WO 9965274 | 12/1999 |
| WO | WO 0001264 | 1/2000 |
| WO | WO 0002417 | 1/2000 |
| WO | WO 0007408 | 2/2000 |
| WO | WO 0007409 | 2/2000 |
| WO | WO 0013464 | 3/2000 |
| WO | WO 0015003 | 3/2000 |
| WO | WO 0033612 | 6/2000 |
| WO | WO 0033613 | 6/2000 |
| WO | WO 03104924 | 12/2003 |
| WO | WO 2006020427 | 2/2006 |
| WO | WO 2007092420 | 8/2007 |
| WO | WO 2008067454 | 6/2008 |
| WO | WO 2009070797 | 6/2009 |
| WO | WO 2009114746 | 9/2009 |
| WO | WO 2009155057 | 12/2009 |
| WO | WO 2010027705 | 3/2010 |
| WO | WO 2010051354 | 5/2010 |
| WO | WO 2011081965 | 7/2011 |
| WO | WO 2013055394 | 4/2013 |
| WO | WO 2013076223 | 5/2013 |
| WO | WO 2014201103 | 12/2014 |
| WO | WO 2015061393 | 4/2015 |
| WO | WO 2015077681 | 5/2015 |
| WO | WO 2015161034 | 10/2015 |
| WO | WO 2016019263 | 2/2016 |
| WO | WO 2016022422 | 2/2016 |

OTHER PUBLICATIONS

NovaSound Int., http://www.novasoundint.com/new_page_t.htm, 2004.

* cited by examiner

SYSTEM AND METHOD FOR DIGITAL SIGNAL PROCESSING IN DEEP DIVING ENVIRONMENT

BACKGROUND OF THE INVENTION

Field of the Invention

The present invention provides for systems and methods relating to processing of a digital signal, including an audio signal, relating to a diver in a deep diving environment.

Description of the Related Art

Divers who operate in deep diving environments face numerous challenges and hazardous conditions inherent in the environment. Included among them are the risks associated with nitrogen narcosis, decompression sickness, oxygen toxicity, and equipment failure. Accordingly, many divers venturing into deep diving environments choose to do so equipped with some form of communication equipment facilitating communication with other divers and/or the surface to help mitigate the dangers associated with the activity. These divers may come to depend heavily on the reliability of their communications device both for routine diving operations and in the event of an emergency situation. Therefore, the audio quality is a chief concern for a diver, as garbled and distorted audio signals can have grave impact on a diver's ability to communicate in a deep diving environment.

Various aspects of diving in a deep diving environment complicate the use of traditional communication devices. For example, divers in a deep diving environment often use specially adapted gaseous mixtures, which affect transmission of sound waves in ways that ordinary communication devices accustomed for use in typical atmosphere or at sea level are rendered ineffective. Examples of gaseous mixtures a diver may be breathing include heliox, a gaseous mixture of helium and oxygen, trimix, a mixture of oxygen, helium and nitrogen, and various other potential mixtures depending on the conditions of the environment and/or skill of the diver. Furthermore, the gaseous mixture may not be at a standard atmospheric pressure. Because the gaseous mixture is a medium for the propagation of sounds produced by the diver, the composition of the gaseous mixture affects propagation of the sound waves therethrough. These differences in sound propagation accordingly affect the properties of the signal and the communications contained therein. It therefore follows that traditional signal processing methods and devices are unsuitable for operation in the deep diving environment.

Accordingly, what is needed in the art is a system and method for processing of audio signals relating to a diver in a deep diving environment. It would be further beneficial for such processing to take into account various aspects of the diver and/or the environment, including the particular gaseous mixture the diver is breathing. In addition, the benefits of processing the audio signal include yielding a clearer signal that can be more efficiently amplified, processed, and/or transmitted, which enhances the safety of the diver.

SUMMARY OF THE INVENTION

The present invention relates to the processing of a digital signal, such as an audio signal, relating to a diver in deep diving environment. Processing of the digital signal yields a clearer digital signal, which may facilitate operational safety of the diver in the diving environment. For example, a clearer digital signal facilitates communications capabilities of the diver, allowing the diver's voice to be more accurately reproduced and heard by e.g. other divers and/or surface operations. This further enhances the safety of the diver by enabling the diver to notify others of any present conditions or emergency situations. Additionally, processing of a digital signal in accordance with the present invention compensates for any inherent deficiencies in the communications equipment the diver may be using.

However, as previously discussed, processing a digital signal in a deep diving environment requires compensating for various aspects of the deep diving environment that are absent from normal, surface conditions. These aspects may include different gaseous mixtures the diver is breathing, for example, which distort the sounds the diver produces and therefore the clarity of the digital signal. The gas the diver is breathing may also be administered at a different pressure than standard atmospheric pressure. In particular, divers breathing gaseous mixtures containing helium speak with a drastically higher pitched voice as a result, which negatively impacts communication abilities. Accordingly, the present invention addresses these and other challenges posed by communicating in a deep diving environment.

As explained in further detail herein, a preferred embodiment of the present invention facilitates digital processing of an audio signal to so as to produce higher-quality sound. Further, digital processing of the audio signal may be accomplished in a manner particularly tuned for processing of the vocal range, thereby improving the audio quality of an audio signal that primarily comprises voice communications.

Accordingly, the present invention is directed to a system and method for processing the digital signal produced by a diver in a deep diving environment.

An illustrative embodiment of a system of the present invention comprises an input device structured to receive the signal. Examples of input devices include a microphone. The system comprises a plurality of processing modules collectively configured to process the received signal. Processing of the pitch changed signal may be achieved according to various desired signal processing processes, as discussed further below. The processed signal is output by an output module, which in various embodiments comprises speakers, a transmitter, and/or any other suitable means of outputting.

A pitch changing module changes the pitch of the received signal.

In a preferred embodiment, at least one of the processing modules comprises a first low shelf filter module configured to filter the pitch changed signal. Furthermore, at least one of the plurality of processing modules comprises a first high shelf filter module configured to filter the signal received from the first low shelf filter.

Additionally, at least one of the processing modules may comprise an automatic gain control module configured to adjust a gain of the filtered signal received from said first high shelf filter module. In various embodiments, the automatic gain control module may comprise a compressor and/or a limiter.

Accordingly, at least one of the processing modules comprises a second low shelf filter module configured to filter the gain adjusted signal. Furthermore, at least one of the processing modules comprises a second high shelf filter module configured to filter the signal received from said second low shelf filter module.

The first shelf filters preferably collectively comprise a first center frequency and a first gain value. Similarly, the second shelf filters collectively comprise a second center frequency and a second gain value. Accordingly, the first center frequency and second center frequency are equal in at least one embodiment, and the first gain value and second gain value are the inverse of one another.

In a preferred embodiment, at least one of the processing modules comprises an equalization module configured to equalize the signal received from said second shelf filters. In at least one embodiment, the equalization module comprises a bell filter. The equalization module may be configured to equalize the signal in accordance with at least one predetermined parameter of the signal. In short, predetermined parameters affects the audio properties of the signal, and equalization that accounts for such parameters when equalizing the signal in at least one embodiment produces a better quality signal. Examples of predetermined parameters of the signal include, but are not limited to, the gender of the diver, an age of the diver, a tonality of the diver's voice, a depth at which the diver is diving, and a type of gas the diver is breathing.

In at least one embodiment, the signal is further processed by a static gain control module configured to adjust the gain of the signal. Such processing by the static gain control may facilitate headroom and/or signal-to-noise ratio. Further, the static gain control module in a preferred embodiment is configured to account for further processing, control, transmission, and/or amplification device or devices that may additionally alter the signal.

As is described above, audio communication plays a role in the safety of divers, particularly in a deep diving environment. Accordingly, the present invention relates to a system for processing of an audio signal, such as one comprising voice communications produced by the diver. In various embodiments, these voice communications are relayed and/or transmitted to others, such as other divers, including divers at various depths, or operators at other locations such as the surface.

Other embodiments of the present invention are directed to a method of signal processing, as is further described herein.

These and other objects, features and advantages of the present invention will become clearer when the drawings as well as the detailed description are taken into consideration.

BRIEF DESCRIPTION OF THE DRAWINGS

For a fuller understanding of the nature of the present invention, reference should be had to the following detailed description taken in connection with the accompanying drawings in which.

Like reference numerals refer to like parts throughout the several views of the drawings.

DETAILED DESCRIPTION OF THE PREFERRED EMBODIMENT

As is illustrated by the accompanying drawings, the present invention is directed to systems and methods for processing of a digital signal, including an audio signal, relating to a diver in a deep diving environment.

Figure 1:
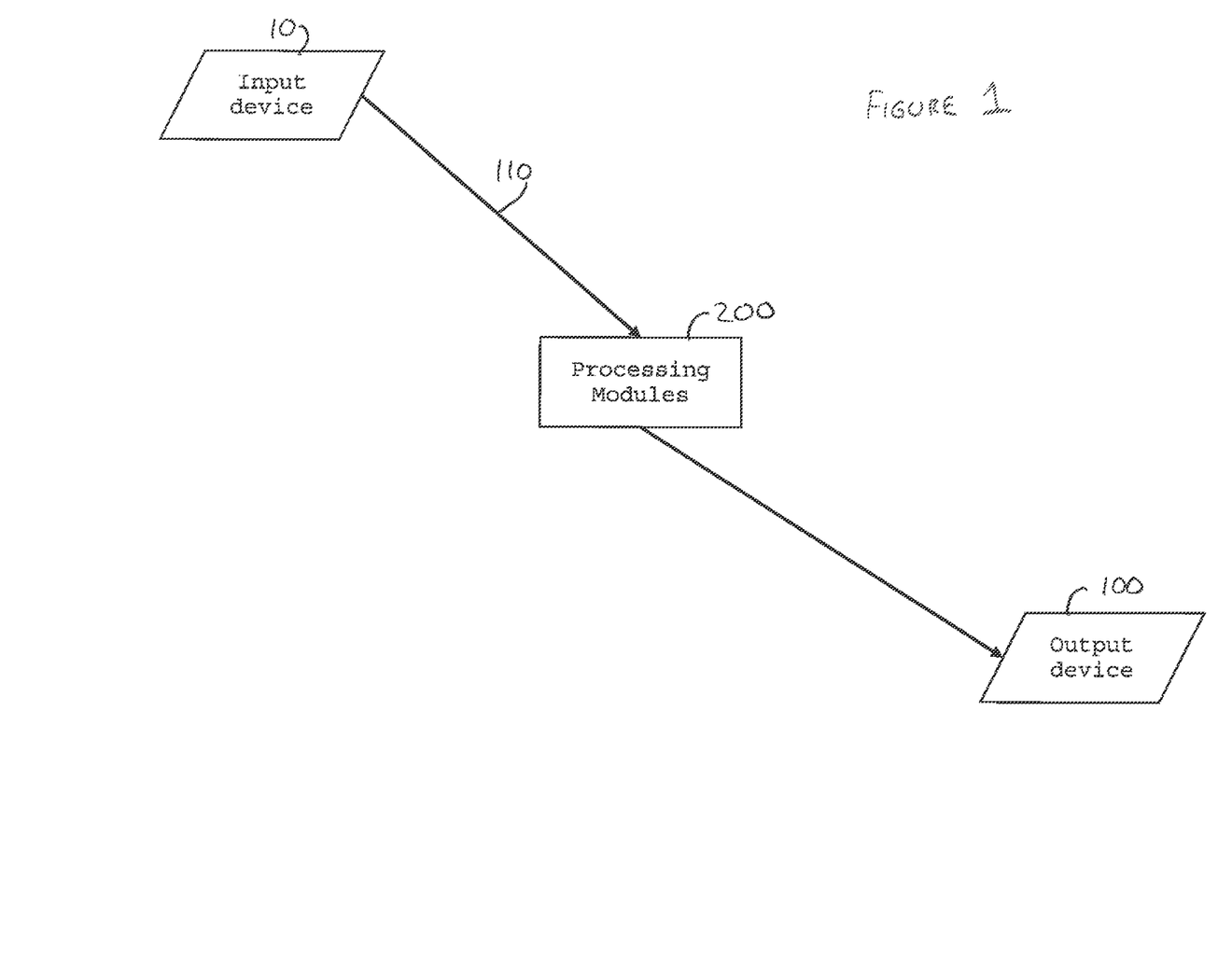
FIG. 1 is a schematic representation of an illustrative embodiment of the present invention.

A preferred embodiment of the present invention comprises a system, generally indicated as 1 in FIG. 1. The system comprises an input device 10, a plurality of modules 200, and an output device 100, each of which will be discussed more fully below.

The input device 10 is at least partially structured and/or configured to receive a signal. The signal is a digital signal, and in various embodiments comprises an audio signal, sounds within the audible range (generally defined as approximately 20 Hz to 20 kHz), and/or vocal communications produced by the diver.

The output device 100 is configured to output a signal processed by the plurality of modules 200. Accordingly, the output device 100 is configured to receive and output a signal from the plurality of modules 200. Examples of output devices include transmission devices, such as for wired and/or wireless transmission from a device worn by a diver as well as speakers or other auditory output devices.

Figure 2:
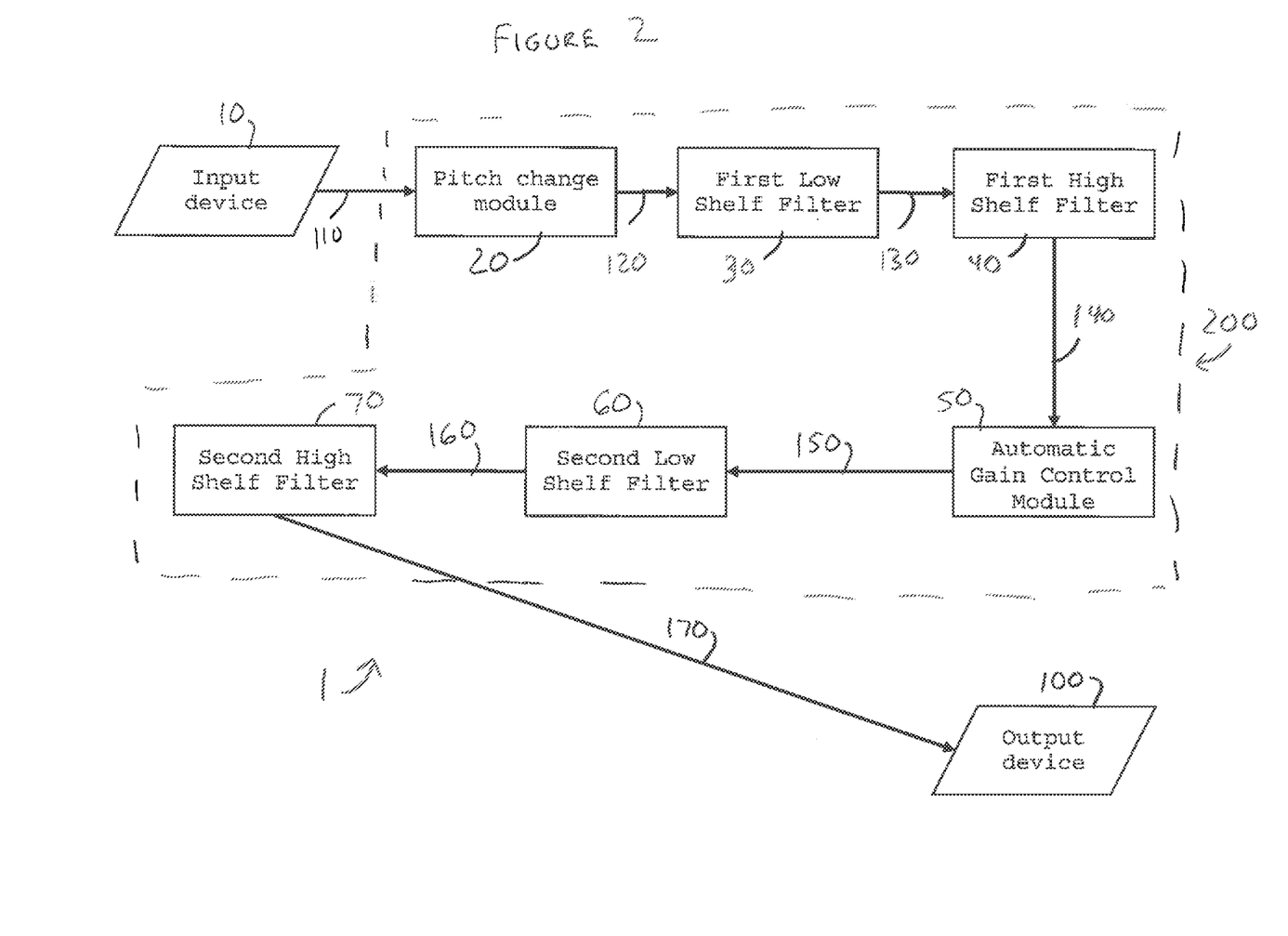
FIG. 2 is a schematic representation of an illustrative embodiment of the present invention.

With reference to FIG. 2, illustrative examples of modules 200 are indicated at 20, 30, 40, 50, 60, 70, 80, and 90. These modules will be discussed in turn. However, though the embodiment of FIG. 2 illustrates an order by which a digital signal is processed by the modules 200, it should be noted that the order is not to be interpreted as limiting. Accordingly, various other embodiments may implement alternative orders and/or combinations, including combinations of these and additional or fewer modules 200. As used herein, modules 200 may comprise a device or devices, circuits, circuitry, and/or other components suitable for processing of a digital signal in accordance with the present invention as described and claimed herein.

In the embodiment of FIG. 2, the pitch of the received signal 110 is changed, adjusted, etc. by a pitch change module 20. The pitch change module 20 changes the pitch of the received signal 110 by an amount within the range of an increase of one octave to a decrease of two octaves, inclusively. The pitch change module 20 is further configured to transmit a pitch changed signal 120, such as for further processing.

With further reference to FIG. 2, the pitch changed signal 120 transmitted by the pitch change module 20 is received by a first low shelf filter module 30. The first low shelf filter module 30 is configured to filter the pitch changed signal 120. The first low shelf filter module 30 is configured to pass all frequencies, but increases or decreases, i.e. boosts or attenuates, the amplitude of frequencies below a predetermined frequency by a specified amount.

A system 1 in accordance with that of FIG. 2 further comprises a first high shelf filter module 40. The first high shelf filter module 40 is configured to filter the signal 130 received from the first low shelf filter module 30. Additionally, the first high shelf filter module 40 is configured to increase or decrease the amplitude of frequencies above a predetermined frequency by a specified amount.

In the preferred embodiment, the first low shelf filter module 30 and the first high shelf filter module 40 are correspondingly configured such that the resultant first filtered signal 140 comprises a differential of 24 decibels between its high and low frequencies.

In at least one embodiment, the first low shelf filter module 30 and first high shelf filter module 40 collectively comprise a first center frequency and a first filter gain value.

With reference to FIG. 2, the system 1 further comprises an automatic gain control module 50 configured to adjust a gain of the first filtered signal 140 so as to produce and transmit a gain adjusted signal 150. The amount of adjustment of the gain of the first filtered signal 140 differs between embodiments of the system 1. For example, in at least one embodiment, the automatic gain control module 50 is configured to adjust the gain of the filtered signal by an amount within the range of 0 decibels and 20 decibels, inclusively. Additionally, in various embodiments, the automatic gain control module 50 may comprise a compressor and/or a limiter.

In the illustrative embodiment of FIG. 2, the gain adjusted signal 150 is then filtered by a second low shelf filter module 60. The second low shelf filter module 60 passes all frequencies, but increases or decreases the amplitude of frequencies below a predetermined frequency by a specified amount.

The system 1 further comprises a second high shelf filter module 70. The second high shelf filter module 70 is configured to filter the signal 160 received from the second low shelf filter module 60. Additionally, the second high shelf filter module 70 is configured to increase or decrease the amplitude of frequencies above a predetermined frequency by a specified amount.

In the preferred embodiment, the second low shelf filter module 60 and second high shelf filter module 70 collectively comprise a second center frequency and a second filter gain value. Additionally, the first shelf filter modules 30, 40 collectively comprise a first center frequency and a first filter gain value. Further still, the first and second center frequencies are equal, and the first and second filter gain values are the inverse of one another.

With further reference to FIG. 2, the second filtered signal 170 produced by the second shelf filter modules 60, 70 is transmitted to the output device 100. However, in various other embodiments, such as those of FIGS. 3 and 4 discussed below, the second filtered signal 170 is processed further.

Figure 3:
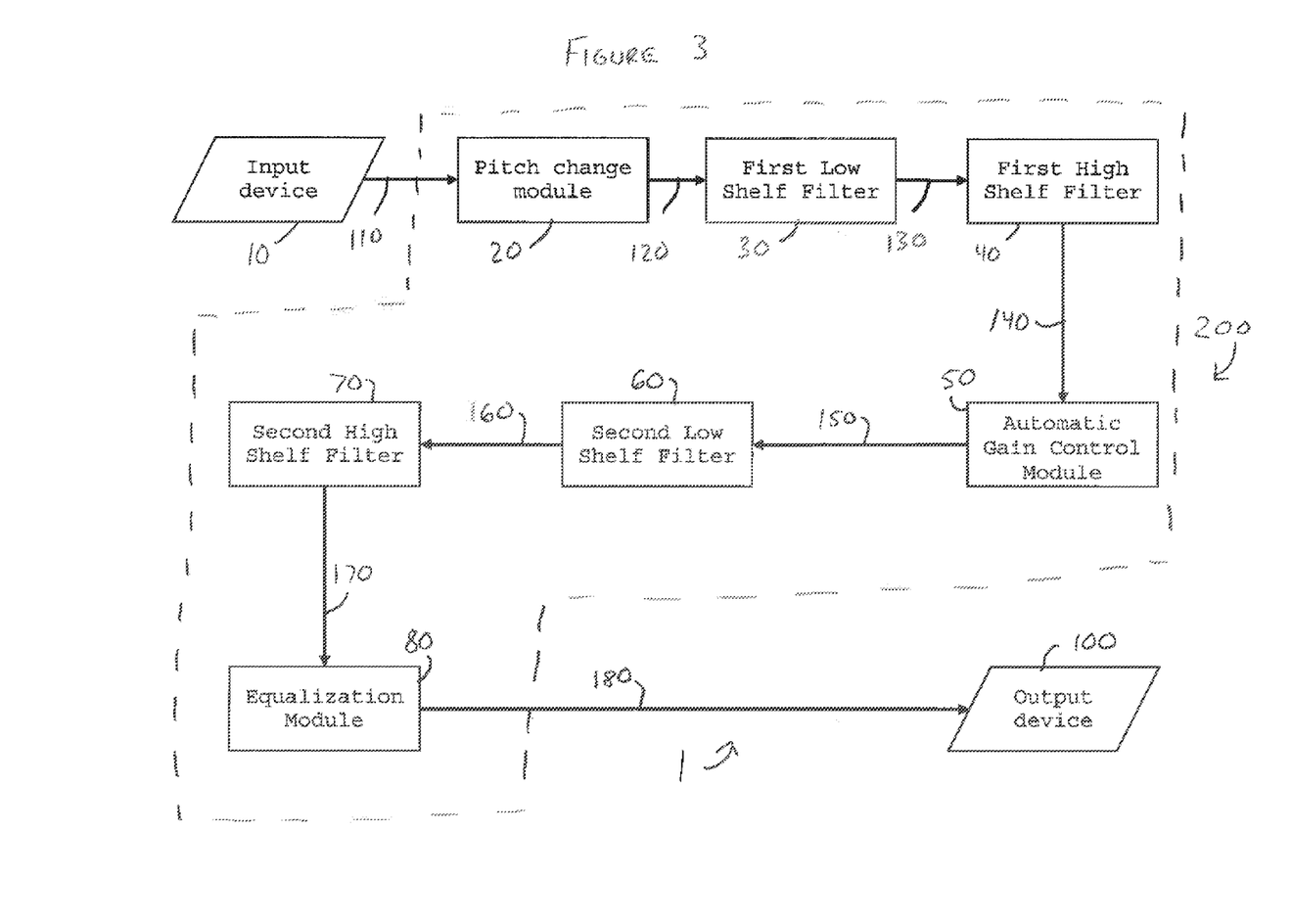
FIG. 3 is a schematic representation of an illustrative embodiment of the present invention.

With respect to FIG. 3, the second filtered signal 170 is transmitted to an equalization module 80 configured to equalize the second filtered signal 170. The equalization module 80 in at least one embodiment is configured to adjust the gain of the signal by an amount within a range of 0 to 25 decibels inclusively. The equalization module 80 may be additionally and/or alternatively configured to equalize frequencies of the signal below 200 Hertz. Furthermore, various embodiments of the equalization module 80 comprise at least one bell filter.

Additionally, in a preferred embodiment, the equalization module 80 is configured to equalize the second filtered signal 170 in accordance with at least one predetermined parameter. Generally speaking, a predetermined parameter should be understood to refer to a property of the digital signal that is to be processed by the system 1, and includes the factors and/or circumstances relating to its creation and/or propagation. Examples include but are not limited to: the diver's gender, the diver's age, the tonality of the diver's voice, a depth at which the diver is diving, and the type of gas the diver is breathing. In various embodiments, the equalization module 80 is configured to equalize the signal in accordance with at least one predetermined parameter. Furthermore, in a preferred embodiment the equalization module 80 is configured to equalize the signal in accordance with a plurality of predetermined parameters, including but not limited to the foregoing.

With further reference to FIG. 3, the equalized signal 180 is transmitted to the output device 100. However, in other embodiments, such as that depicted in FIG. 4, the equalized signal 180 is further processed.

Figure 4:
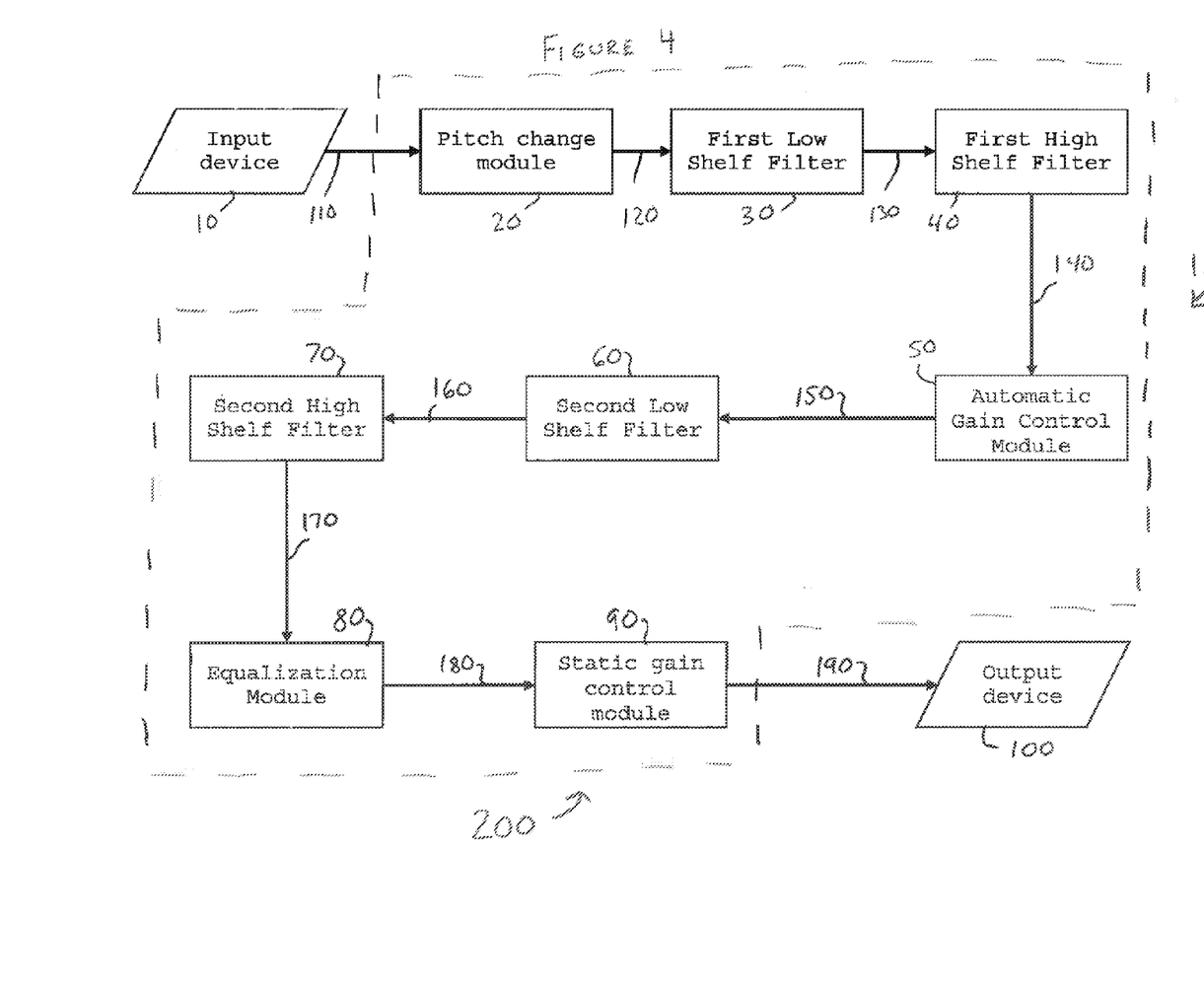
FIG. 4 is a schematic representation of an illustrative embodiment of the present invention.

As shown in the illustrative embodiment of FIG. 4, the equalized signal 180 is transmitted to a static gain control module 90. The static gain control module 90 is configured to adjust the gain of the received signal. Such gain adjustment by the static gain control module 90 may comprise adjustment of the signal-to-noise ratio of the signal and/or facilitation of a desired headroom in the resultant static gain adjusted signal 190. In any case, the static gain adjusted signal 190 is then transmitted by the static gain control module 90, such as to the output device 100.

Figure 5:
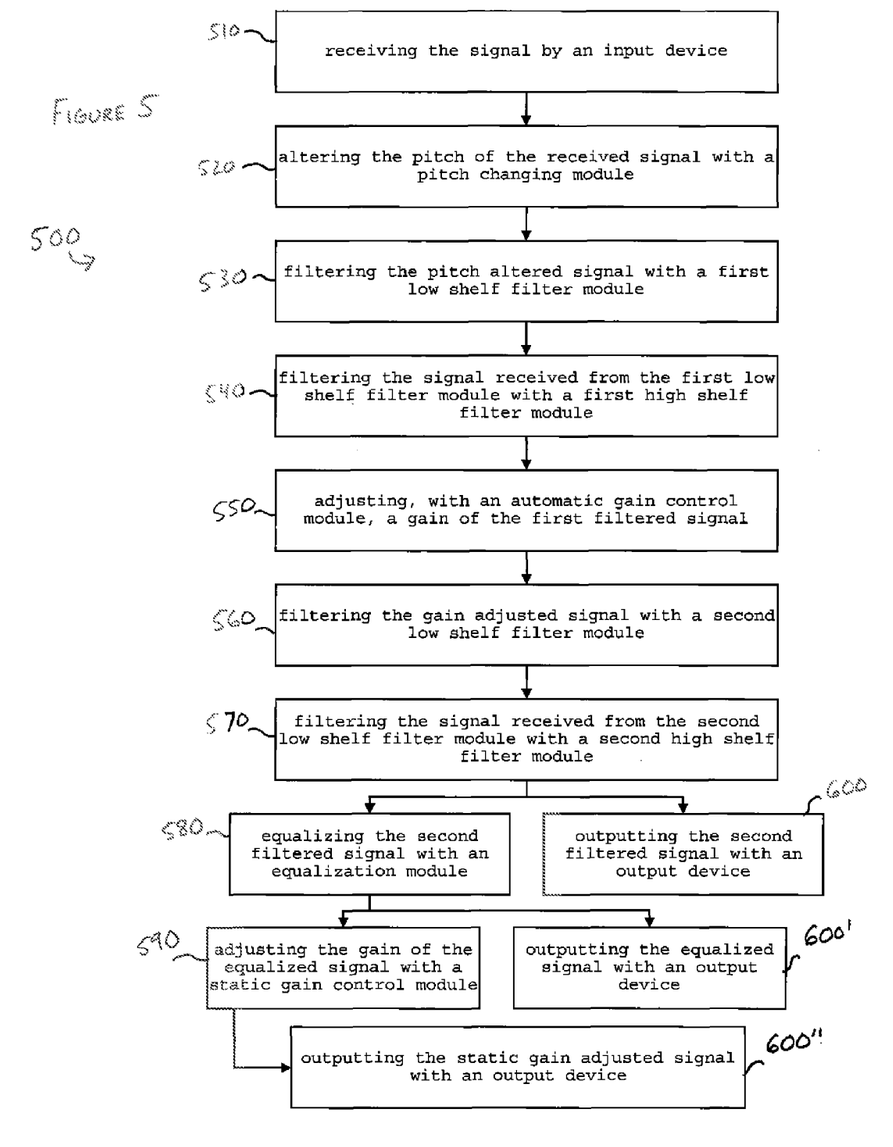
FIG. 5 is a schematic representation of an illustrative embodiment of a method in accordance with the present invention.

With primary reference to FIG. 5, a preferred embodiment of a method 500 in accordance with the present invention is provided. It should further be understood that various embodiments of the method 500 may incorporate the components of the system 1 previously described. In addition, the steps of the method 500, discussed below, need not be completed in the illustrated order.

In the embodiment of FIG. 5, the method 500 comprises receiving the digital signal by an input device 510. The pitch of the received signal is then altered by a pitch changing module, as at 520. In at least one embodiment, the degree of the change of the pitch of the received signal is within the range of −2 to +1 octaves. In other words, the pitch of the signal and/or parts thereof may be decreased by as much as two octaves or increased by as much as one octave.

The method 500 of FIG. 5 further comprises filtering the pitch altered signal with a first low shelf filter module as at 530, and filtering the resultant signal with a first high shelf filter module, as at 540.

The resultant first filtered signal is then transmitted to an automatic gain control module, which adjusts the gain of the first filtered signal, as at 560.

The gain adjusted signal is transmitted to and filtered by a second low shelf filter, as at 560, and a second high shelf filter, as at 570. The resultant signal may then be output by an output device, as at 600, or further processed.

Additionally, the second filtered signal produced by the second high shelf filter is equalized by an equalization module, as at 580. The resultant equalized signal may then be output by an output device, as at 600', or further processed.

Further, the equalized signal produced by the equalization module is transmitted to a static gain control module, which adjusts the gain of the signal, as at 590. The resultant static gain adjusted signal may then be output by an output device, as at 600", or further processed.

Since many modifications, variations and changes in detail can be made to the described preferred embodiment of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. A system for processing of an audio signal relating to a diver in a deep diving environment, said system comprising:
   an input device structured to receive the audio signal,
   a pitch changing module configured to change the pitch of the received signal,
   a first low shelf filter module configured to filter the pitch changed signal,
   a first high shelf filter module configured to filter the signal received from the first low shelf filter module, thereby creating a first filtered signal,
   an automatic gain control module configured to adjust a gain of the first filtered signal, a second low shelf filter module configured to filter the gain adjusted signal, and a second high shelf filter module configured to filter the signal received from said second low shelf filter module, thereby creating a second filtered signal said first low shelf filter module and said first high shelf filter module collectively including a first center frequency and a first filter gain value, said second low shelf filter module and said second high shelf filter module collectively including a second center frequency and a second filter gain value, said first center frequency being equal to said second center frequency, and said first filter gain value being the inverse of said second filter gain value.

2. A system as recited in claim 1, said pitch changing module being configured to change the pitch of the received signal by between −2 octaves to +1 octave.

3. A system as recited in claim 1, said first low shelf filter module and said first high shelf filter module being correspondingly configured to create a 24-decibel differential between high frequencies of the filtered signal and low frequencies of the filtered signal.

4. A system as recited in claim 1, wherein said automatic gain control module comprises a compressor.

5. A system as recited in claim 1, wherein said automatic gain control module comprises a limiter.

6. A system as recited in claim 1, said automatic gain control module being configured to adjust the gain of the filtered signal by between 0 decibels to 20 decibels.

7. A system as recited in claim 1, further comprising an equalization module configured to equalize the second filtered signal.

8. A system as recited in claim 7, further comprising an output device configured to output the equalized signal.

9. A system as recited in claim 7, said equalization module being configured to adjust the gain of the signal by between 0 to 25 decibels.

10. A system as recited in claim 7, wherein said equalization module is configured to equalize frequencies of the signal below 200 Hertz.

11. A system as recited in claim 7, wherein said equalization module comprises at least one bell filter.

12. A system as recited in claim 7, said equalization module being configured to equalize the signal in accordance with at least one predetermined parameter of the signal.

13. A system as recited in claim 12, wherein said predetermined parameter of the signal is selected from a group consisting of a gender of the diver, an age of the diver's, a tonality of the diver's voice, a depth at which the diver is diving, and a type of gas the diver is breathing.

14. A system as recited in claim 7, further comprising a static gain control module configured to adjust the gain of the equalized signal.

15. A system as recited in claim 14, further comprising an output device configured to output the static gain adjusted signal.

16. A system as recited in claim 1, further comprising an output device configured to output the second filtered signal.

17. A method for processing of an audio signal relating to a diver in a deep diving environment, said method comprising:

receiving the audio signal by an input device, altering the pitch of the received signal with a pitch changing module, filtering the pitch altered signal with a first low shelf filter module, filtering the signal received from the first low shelf filter module with a first high shelf filter module, thereby creating a first filtered signal, the first low shelf filter module and the first high shelf filter module collectively defining a first center frequency and a first filter gain value, adjusting, with an automatic gain control module, a gain of the first filtered signal, filtering the gain adjusted signal with a second low shelf filter module, filtering the signal received from the second low shelf filter module with a second high shelf filter module, the second low shelf filter module and the second high shelf filter module collectively defining a second center frequency equal to the first center frequency, and a second filter gain value inverse to the first filter gain value, thereby creating a second filtered signal.

18. A method as recited in claim 17, wherein the pitch changing module is configured to change the pitch of the received signal by between −2 octaves to +1 octave.

19. A method as recited in claim 17, wherein the first low shelf filter module and the first high shelf filter module are correspondingly configured to create a 24-decibel differential between high frequencies of the first filtered signal and low frequencies of the first filtered signal.

20. A method as recited in claim 17, wherein the automatic gain control module comprises a compressor.

21. A method as recited in claim 17, wherein the automatic gain control module comprises a limiter.

22. A method as recited in claim 17, wherein the automatic gain control module is configured to adjust the first gain of the filtered signal by between 0 decibels to 20 decibels.

23. A method as recited in claim 17, further comprising equalizing the second filtered signal with an equalization module.

24. A method as recited in claim 23, further comprising outputting the equalized signal with an output device.

25. A method as recited in claim 23, wherein the equalization module is configured to adjust the gain of the signal by between 0 to 25 decibels.

26. A method as recited in claim 23, wherein the equalization module is configured to equalize frequencies of the signal below 200 Hertz.

27. A method as recited in claim 23, wherein the equalization module comprises at least one bell filter.

28. A method as recited in claim 23, wherein the equalization module is configured to equalize the signal according to at least one predetermined parameter of the signal.

29. A method as recited in claim 28, wherein the predetermined parameter is selected from a group consisting of the diver's gender, the diver's age, a tonality of the diver's voice, a depth at which the diver is diving, and a type of gas the diver is breathing.

30. A method as recited in claim 23, further comprising adjusting the gain of the equalized signal with a static gain control module.

31. A method as recited in claim 30, further comprising outputting the static gain adjusted signal with an output device.

32. A method as recited in claim 17, further comprising outputting the second filtered signal with an output device.

* * * * *